(12) United States Patent
Malatkar

(10) Patent No.: US 8,754,516 B2
(45) Date of Patent: Jun. 17, 2014

(54) BUMPLESS BUILD-UP LAYER PACKAGE WITH PRE-STACKED MICROELECTRONIC DEVICES

(75) Inventor: Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 12/868,816

(22) Filed: Aug. 26, 2010

(65) Prior Publication Data
US 2012/0049382 A1  Mar. 1, 2012

(51) Int. Cl.
*H01L 23/48* (2006.01)

(52) U.S. Cl.
USPC ........... 257/690; 257/678; 257/687; 257/692; 257/693; 257/E23.011

(58) Field of Classification Search
USPC ........... 257/678, 734, 690, 687, 693, E23.011
See application file for complete search history.

(56) References Cited

U.S. PATENT DOCUMENTS

| | | | |
|---|---|---|---|
| 5,353,498 A | 10/1994 | Fillion et al. | |
| 5,497,033 A | 3/1996 | Fillion et al. | |
| 5,527,741 A | 6/1996 | Cole et al. | |
| 5,841,193 A | 11/1998 | Eichelberger | |
| 5,866,943 A * | 2/1999 | Mertol | 257/712 |
| 6,046,507 A * | 4/2000 | Hatchard et al. | 257/790 |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,489,185 B1 | 12/2002 | Towle et al. | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |

(Continued)

FOREIGN PATENT DOCUMENTS

WO 2012/027075 A2 3/2012
WO WO2012/027075 A3 3/2012

OTHER PUBLICATIONS

U.S. Appl. No. 11/860,922, filed Sep. 25, 2007, 19 pages.
U.S. Appl. No. 12/590,350, filed Nov. 6, 2009, 20 pages.

(Continued)

*Primary Examiner* — Eva Yan Mantalvo
(74) *Attorney, Agent, or Firm* — Winkle, PLLC

(57) ABSTRACT

The present disclosure relates to the field of integrated circuit package design and, more particularly, to packages using a bumpless build-up layer (BBUL) designs. Embodiments of the present description relate to the field of fabricating microelectronic packages, wherein a first microelectronic device having through-silicon vias may be stacked with a second microelectronic device and used in a bumpless build-up layer package.

16 Claims, 5 Drawing Sheets

(56) References Cited

U.S. PATENT DOCUMENTS

| | | | |
|---|---|---|---|
| 6,734,534 | B1 | 5/2004 | Vu et al. |
| 6,794,223 | B2 | 9/2004 | Ma et al. |
| 6,818,544 | B2 | 11/2004 | Eichelberger et al. |
| 6,825,063 | B2 | 11/2004 | Vu et al. |
| 6,841,413 | B2 | 1/2005 | Liu et al. |
| 6,888,240 | B2 | 5/2005 | Towle et al. |
| 6,894,399 | B2 | 5/2005 | Vu et al. |
| 6,902,950 | B2 | 6/2005 | Ma et al. |
| 6,964,889 | B2 | 11/2005 | Ma et al. |
| 7,067,356 | B2 | 6/2006 | Towle et al. |
| 7,071,024 | B2 | 7/2006 | Towle et al. |
| 7,078,788 | B2 | 7/2006 | Vu et al. |
| 7,109,055 | B2 | 9/2006 | McDonald et al. |
| 7,112,467 | B2 | 9/2006 | Eichelberger et al. |
| 7,160,755 | B2 | 1/2007 | Lo et al. |
| 7,183,658 | B2 | 2/2007 | Towle et al. |
| 7,189,596 | B1 | 3/2007 | Mu et al. |
| 7,416,918 | B2 | 8/2008 | Ma |
| 7,420,273 | B2 | 9/2008 | Liu et al. |
| 7,425,464 | B2 | 9/2008 | Fay et al. |
| 7,442,581 | B2 | 10/2008 | Lytle et al. |
| 7,476,563 | B2 | 1/2009 | Mangrum et al. |
| 7,588,951 | B2 | 9/2009 | Mangrum et al. |
| 7,595,226 | B2 | 9/2009 | Lytle et al. |
| 7,619,901 | B2 | 11/2009 | Eichelberger et al. |
| 7,632,715 | B2 | 12/2009 | Hess et al. |
| 7,648,858 | B2 | 1/2010 | Tang et al. |
| 7,651,889 | B2 | 1/2010 | Tang et al. |
| 7,655,502 | B2 | 2/2010 | Mangrum et al. |
| 7,659,143 | B2 | 2/2010 | Tang et al. |
| 2004/0238936 | A1* | 12/2004 | Rumer et al. ............ 257/688 |
| 2007/0152313 | A1* | 7/2007 | Periaman et al. ......... 257/686 |
| 2007/0155048 | A1 | 7/2007 | Lee et al. |
| 2008/0054448 | A1 | 3/2008 | Lu et al. |
| 2008/0093723 | A1 | 4/2008 | Myers et al. |
| 2008/0315377 | A1 | 12/2008 | Eichelberger et al. |
| 2008/0315391 | A1 | 12/2008 | Kohl et al. |
| 2009/0072382 | A1 | 3/2009 | Guzek |
| 2009/0079063 | A1 | 3/2009 | Chrysler et al. |
| 2009/0079064 | A1 | 3/2009 | Tang et al. |
| 2009/0212416 | A1 | 8/2009 | Skeete |
| 2009/0283898 | A1 | 11/2009 | Janzen et al. |
| 2009/0294942 | A1 | 12/2009 | Palmer et al. |
| 2009/0321947 | A1 | 12/2009 | Pratt |
| 2010/0044855 | A1 | 2/2010 | Eichelberger et al. |
| 2010/0047970 | A1 | 2/2010 | Eichelberger et al. |
| 2011/0140247 | A1* | 6/2011 | Pagaila et al. ............ 257/659 |

OTHER PUBLICATIONS

U.S. Appl. No. 12/655,321, filed Dec. 29, 2009, 26 pages.
U.S. Appl. No. 12/655,335, filed Dec. 29, 2009, 36 pages.
U.S. Appl. No. 12/761,782, filed Apr. 16, 2010, 36 pages.
U.S. Appl. No. 12/755,183, filed Apr. 6, 2010, 21 pages.
U.S. Appl. No. 12/755,201, filed Apr. 6, 2010, 23 pages.
U.S. Appl. No. 12/725,925, filed Mar. 17, 2010, 34 pages.
U.S. Appl. No. 12/753,637, filed Apr. 2, 2010, 34 pages.
U.S. Appl. No. 09/640,961, filed Aug. 16, 2000, 70 pages.
U.S. Appl. No. 12/778,335, filed May 12, 2010, 43 pages.
U.S. Appl. No. 12/827,323, filed Jun. 30, 2010, 28 pages.
U.S. Appl. No. 12/830,875, filed Jul. 6, 2010, 41 pages.
International Search Report and Written Opinion Received for PCT Patent Application No. PCT/US2011/046287, Mailed on Mar. 26, 2012, 10 pages.
International Preliminary Report on Patentability and Written Opinion received for PCT Patent Application No. PCT/US2011/046287 mailed on Mar. 7, 2013, 7 pages.

* cited by examiner

BUMPLESS BUILD-UP LAYER PACKAGE WITH PRE-STACKED MICROELECTRONIC DEVICES

BACKGROUND

Embodiments of the present description generally relate to the field of microelectronic device package designs and, more particularly, to a microelectronic device package having pre-stacked microelectronic devices in a bumpless build-up layer (BBUL) design.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
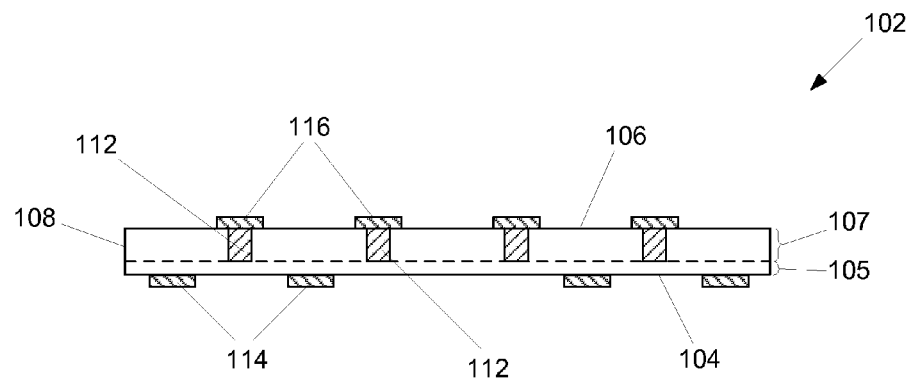
FIGS. 1-9 illustrate side cross-sectional views of a process of forming a microelectronic device package having pre-stacked microelectronic devices in a bumpless build-up layer design.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein a first microelectronic device having through-silicon vias may be stacked with a second microelectronic device and used in a bumpless build-up layer package.

FIGS. 1-8 illustrate cross-sectional views of an embodiment of a process of forming a bumpless build-up layer coreless (BBUL-C) microelectronic package. As shown in FIG. 1, a first microelectronic device 102 may be provided, wherein the first microelectronic device 102 includes an active surface 104, an opposing back surface 106 that is substantially parallel to the first microelectronic device active surface 104, and at least one side 108 extending from the first microelectronic device active surface 104 to the first microelectronic device back surface 106. The first microelectronic device 102 may have an active portion 105 proximate the first microelectronic device active surface 104 and a substrate portion 107 extending from the first microelectronic device active portion 105 to the first microelectronic device back surface 106. As will be understood to those skilled in the art, the first microelectronic device active portion 105 comprises the integrated circuitry and interconnections (not shown) of the first microelectronic device 102. The first microelectronic device 102 may be any appropriate integrated circuit device including but not limited to a microprocessor (single or multi-core), a memory device, a chipset, a graphics device, an application specific integrated circuit, or the like. In one embodiment, the first microelectronic device 102 is a microprocessor.

The first microelectronic device 102 may have at least one conductive via extending through the first microelectronic device substrate portion 107 from the first microelectronic device back surface 106 to the first microelectronic device active portion 105. Such a conductive via configuration is known as a through-silicon via 112. The first microelectronic device through-silicon via(s) 112 may be in electrical communication with the integrated circuitry (not shown) in the first microelectronic device active portion 105. Each first microelectronic device through-silicon via 112 may have a contact land 116 on the first microelectronic device back surface 106. Although the first microelectronic device back surface contact lands are shown directly adjacent the first microelectronic device through-silicon vias 112, it is understood that they may be positioned at any appropriate location on the first microelectronic die back surface with conductive traces forming electrical contact therebetween. The first microelectronic device through-silicon vias 112 and the first microelectronic device back surface contact lands 116 may be fabricated by any technique known in the art, including, but not limited to drilling (laser and ion), lithography, plating, and deposition, and may be made of any appropriate conductive material, including but not limited to copper, aluminum, silver, gold, or alloys thereof.

Figure 2:
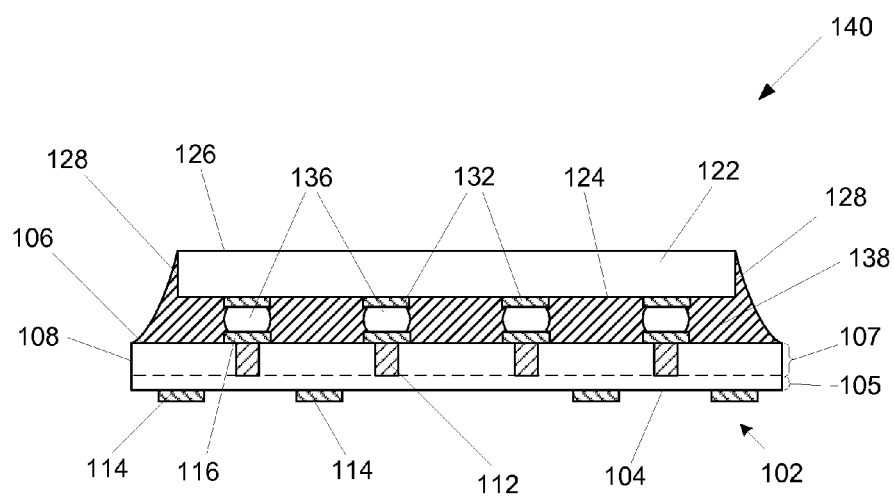

As shown in FIG. 2, a second microelectronic device 122 may be aligned with the first microelectronic device 102. The second microelectronic device 122 may have an active surface 124, a back surface 126 that is substantially parallel to the second microelectronic device active surface 124, and at least one side 128 extending from the second microelectronic device active surface 124 to the second microelectronic device back surface 126. The second microelectronic device 122 may further include at least one contact land 132 adjacent the microelectronic device active surface 124, wherein the second microelectronic device contact lands 132 may be connected to integrated circuits (not shown) within the second microelectronic device 122. The second microelectronic device 122 may be any appropriate integrated circuit device including but not limited to a microprocessor (single or multi-core), a memory device, a chipset, a graphics device, an application specific integrated circuit, or the like. In one embodiment, the second microelectronic device 122 is a memory device. The second microelectronic device contact lands 132 may be any appropriate conductive material, including but not limited to copper, aluminum, silver, gold, or alloys thereof.

As further shown in FIG. 2, the second microelectronic device 122 may be attached to the first microelectronic device 102 through a plurality of interconnects 136 (shown as solder balls) connecting the second microelectronic device contact lands 132 to the first microelectronic device back surface contact lands 116, thereby forming a stacked structure 140. An underfill material 138, such as an epoxy material, may be disposed between the first microelectronic device back surface 106 and the second microelectronic device active surface 124, and around the plurality of interconnects 136. The underfill material 138 may enhance the structural integrity of the stacked structure 140.

Figure 3:
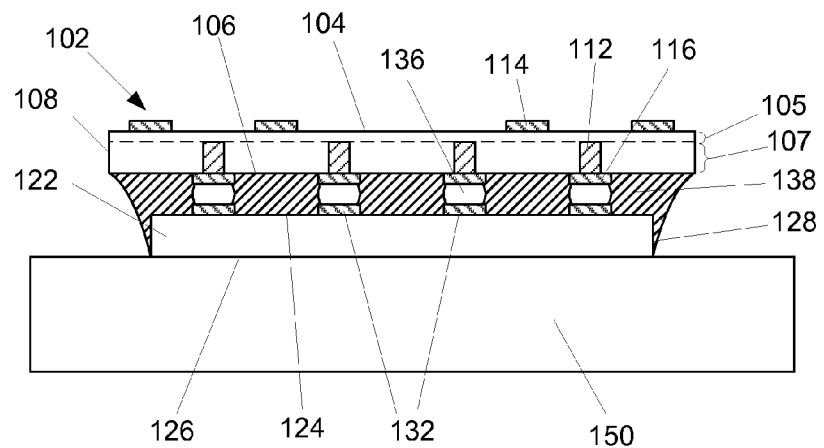
Figure 4:
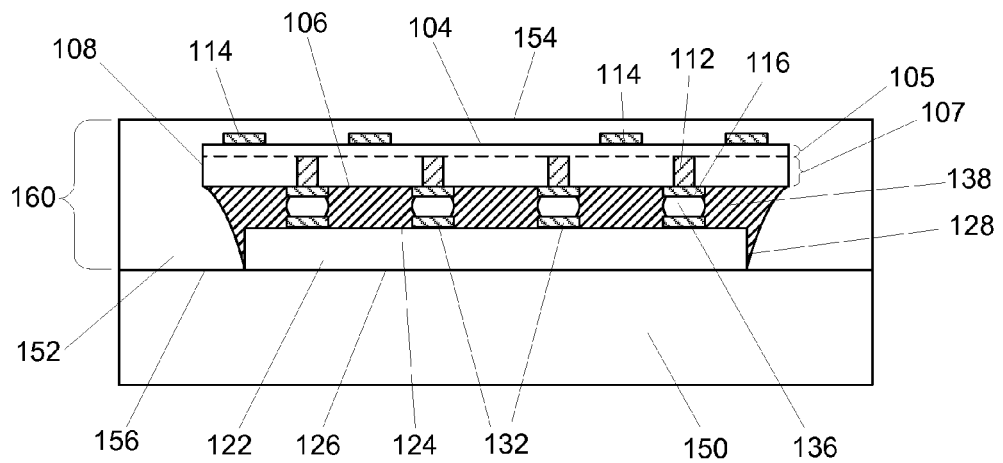

As shown in FIG. 3, the second microelectronic device back surface 126 may be attached to a carrier 150, such as with a DBF (die backside film) or an adhesive (not shown), as known to those skilled in the art. An encapsulation material 152 may be disposed adjacent the second microelectronic device side(s) 128, the first microelectronic side(s) 108, and over the first microelectronic device active surface 104 including the first microelectronic device active surface contact land(s) 114, thereby forming a front surface 154 of the encapsulation material 152, as shown in FIG. 4. The placement of the second microelectronic device back surface 126 on the carrier 150 may result in a back surface 156 of the encapsulation material 152 being formed substantially planar with the second microelectronic device back surface 126, thereby forming substrate 160.

The encapsulation material 152 may be disposed by any process known in the art, including a laminated process, as will be understood to those skilled in the art, and may be any appropriate dielectric material, including, but not limited to silica-filled epoxies, such as are available from Ajinomoto Fine-Techno Co., Inc., 1-2 Suzuki-cho, Kawasaki-ku, Kawasaki-shi, 210-0801, Japan (Ajinomoto GX13, Ajinomoto GX92, and the like).

Figure 5:
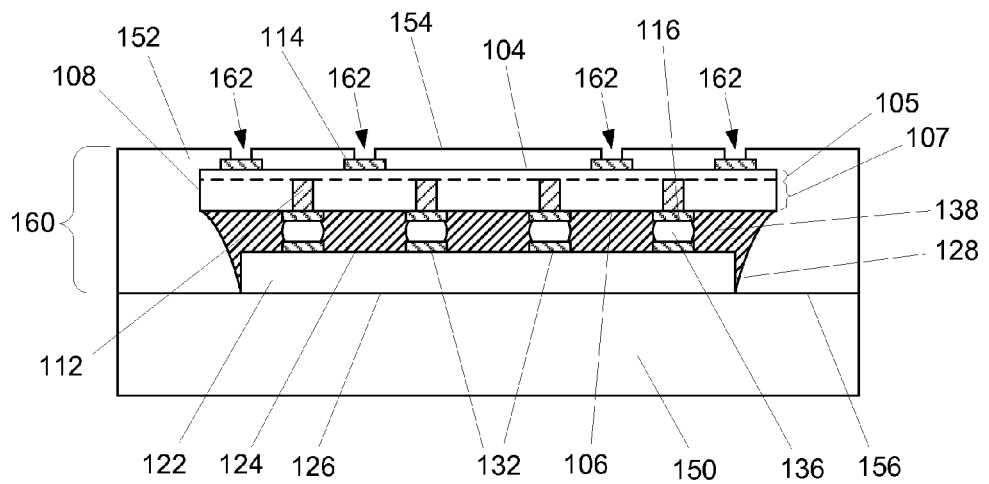
Figure 6:
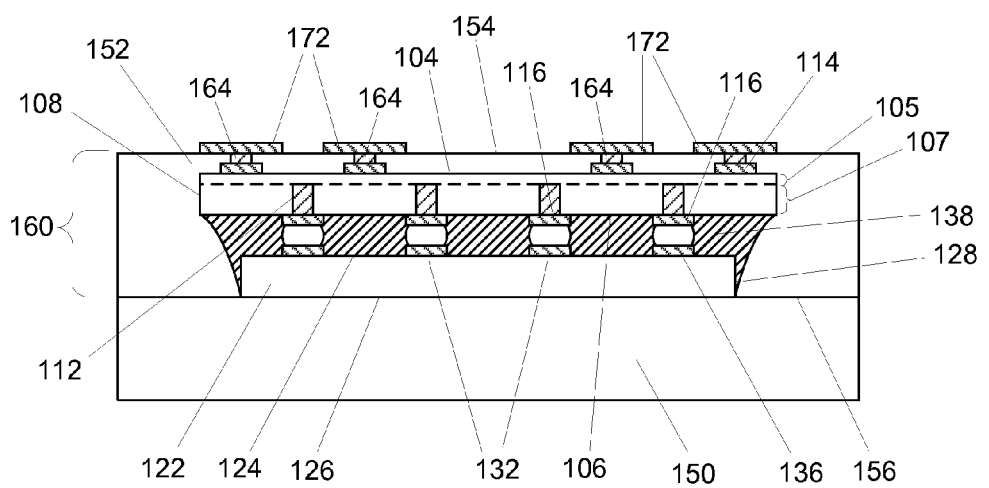

Vias 162 may be formed through the encapsulation material front surface 154 to expose at least a portion of each first microelectronic device active surface contact land 114, as shown in FIG. 5. The vias 162 of FIG. 5 may be formed by any technique known in the art, including but not limited to laser drilling, ion drilling, and lithography, as will be understood to those skilled in the art. A patterning and plating process may be used to fill the vias 162 to form conductive vias 164 and to simultaneously form first layer conductive traces 172, as will be understood by those skilled in the art, as shown in FIG. 6.

Figure 7:
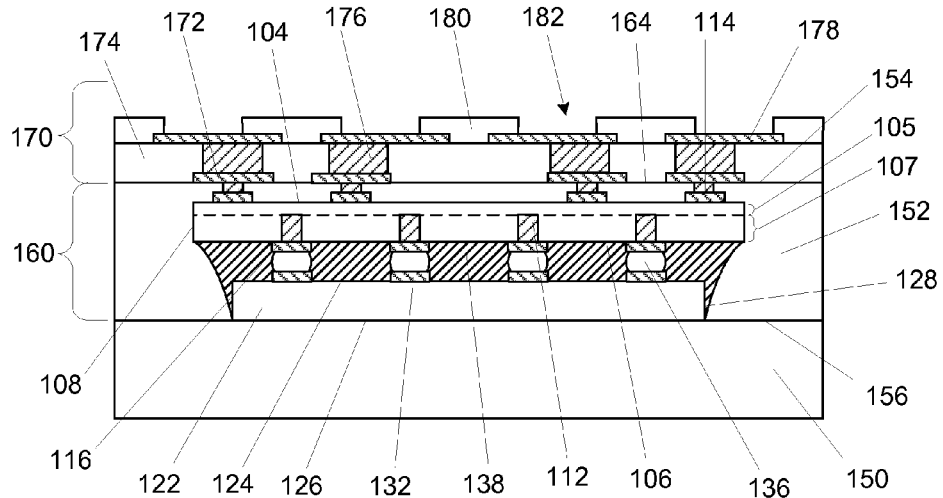

As shown in FIG. 7, a build-up layer 170 may be formed on the encapsulation material front surface 154. The build-up layer 170 may comprise a plurality of dielectric layers with conductive traces formed on each dielectric layer with conductive vias extending through each dielectric layer to connect the conductive traces on different layers. Referring to FIG. 7, the build-up layer 170 may comprise the first layer conductive traces 172 with a dielectric layer 174 formed adjacent the first layer conductive traces 172 and the encapsulation material front surface 154. At least one trace-to-trace conductive via 176 may extend through the dielectric layer 174 to connect at least one first layer conductive trace 172 to a second layer conductive trace 178. A solder resist material 180 may be patterned on the dielectric layer 174 and second layer conductive traces 178 having at least one opening 182 exposing at least a portion of the second layer conductive traces 178.

Figure 8:
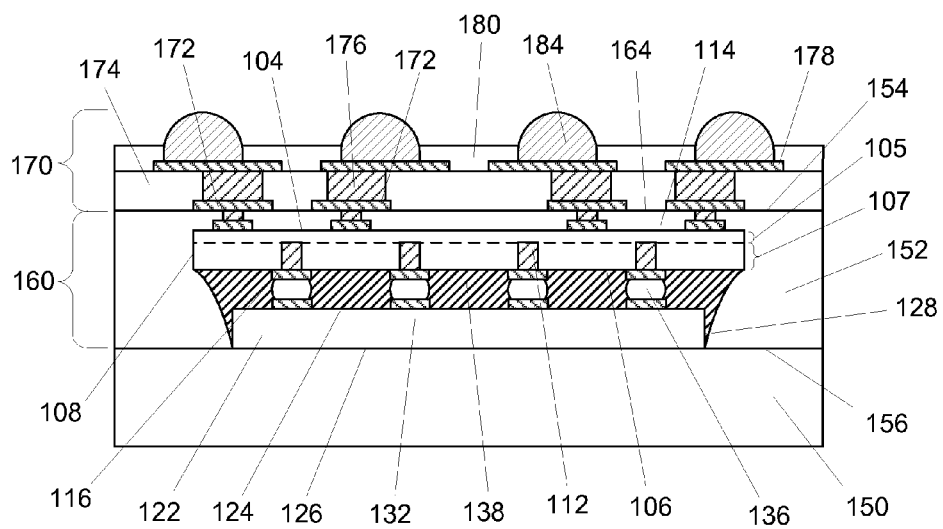

As shown in FIG. 8, at least one external interconnect 184 may be formed on the second layer conductive traces 178 through patterned openings 182 in the solder resist material 180. The external interconnects 184 may be a solder material and may be used to connect the build-up layer 170 to external components (not shown).

It is understood that although only one dielectric layer and two conductive trace layers are shown, the build-up layer 170 may be any appropriate number of dielectric layers and conductive trace layers. The dielectric layer(s), such as the dielectric layer 174, may be formed by any technique known in the art and may be any appropriate dielectric material. The conductive trace layers, such as first layer conductive traces 172 and the second layer conductive traces 178, and the conductive vias 176, may be fabricated by any technique known in the art, including but not limited to plating and lithography, and may be made of any appropriate conductive material, including but not limited to copper, aluminum, silver, gold, or alloys thereof.

Figure 9:
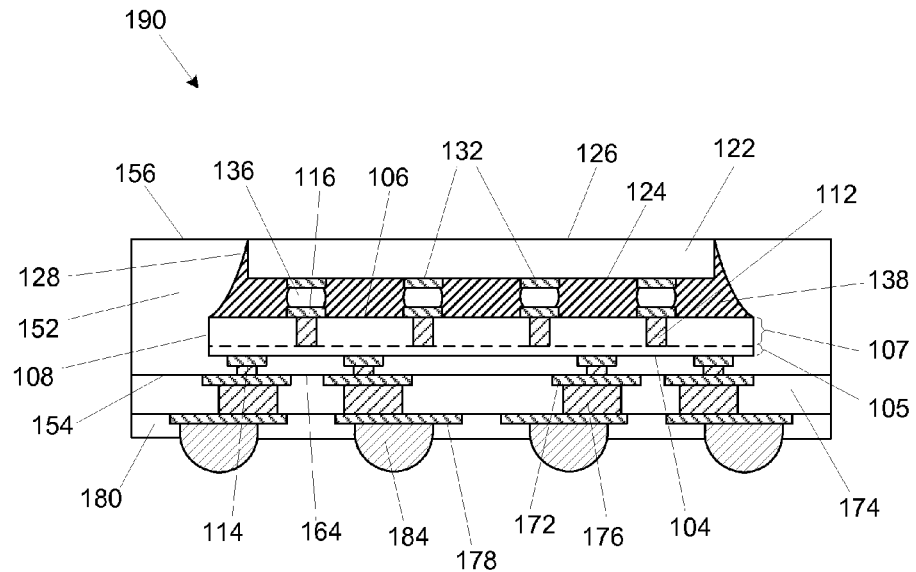

The carrier 150 may be removed, resulting in a microelectronic package 190, as shown in FIG. 9. The stacking and encapsulation of the first microelectronic device 102 and the second microelectronic device 122 results in the microelectronic package 190 being sufficiently thick enough to prevent warpage in the microelectronic package 190, which may result in a reduction in yield losses from solder ball bridging and/or non-contact opens, as will be understood to those skilled in the art.

Figure 10:
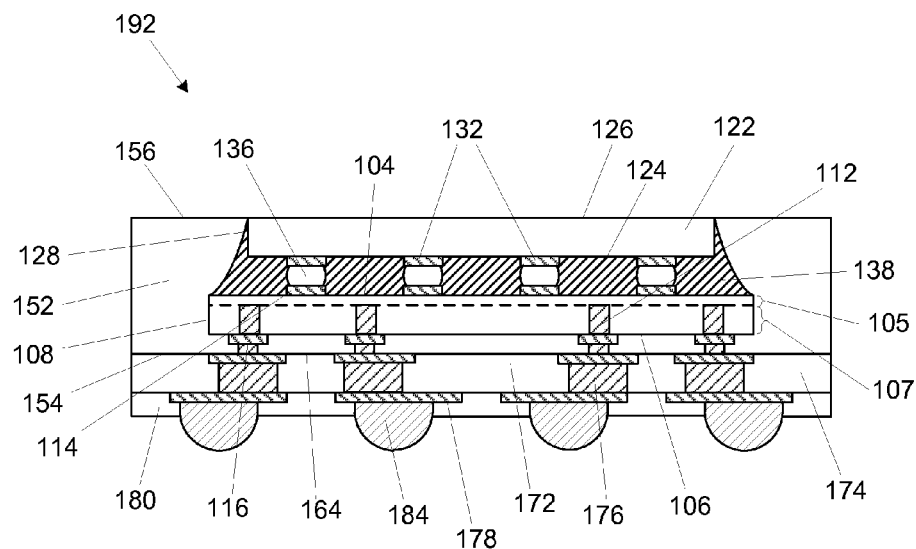
FIG. 10 illustrates a side cross-sectional view of another embodiment of a microelectronic device package having pre-stacked microelectronic devices in a bumpless build-up layer design.

Another embodiment of a microelectronic package 192 is shown in FIG. 10. In this embodiment, the first microelectronic device active surface 104 may be in electrical communication with the second microelectronic device active surface 124 through the interconnects 136 extending between the first microelectronic device active surface contact land 114 and the second microelectronic device contact lands 132. The build-up layer 170 may be formed proximate on the first microelectronic device back surface and may be in electrical communication with the first microelectronic device through-silicon vias 112.

It is also understood that the subject matter of the present description is not necessarily limited to specific applications illustrated in FIGS. 1-10. The subject matter may be applied to other stacked device applications. Furthermore, the subject matter may also be used in any appropriate application outside of the microelectronic device fabrication field. Furthermore, the subject matter of the present description may be a part of a larger bumpless build-up package, it may include multiple stacked microelectronic dice, it may be formed at a wafer level, or any number of appropriate variations, as will be understood to those skilled in the art.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A microelectronic package comprising:
   a first microelectronic device having an active surface, an opposing back surface, and at least one side, wherein the first microelectronic device includes at least one through-silicon via extending partially through the first microelectronic device from the first microelectronic device back surface to a first microelectronic device active portion;
   a second microelectronic device having an active surface, an opposing back surface, and at least one side;
   at least one interconnect electrically connecting and extending between and attached to the second microelectronic device active surface and the at least one first microelectronic device through-silicon via proximate the first microelectronic device back surface; and
   an encapsulation material adjacent the at least one first microelectronic device side and proximate the at least one second microelectronic device side, wherein the encapsulation material includes a back surface substantially planar to the second microelectronic device back surface.

2. The microelectronic package of claim 1, wherein the encapsulation material includes a front surface proximate the first microelectronic device active surface.

3. The microelectronic package of claim 2, further including a build-up layer formed adjacent encapsulation material front surface.

4. The microelectronic package of claim 3, wherein the build-up layer is electrically connected to the first microelectronic device active surface.

5. The microelectronic package of claim 1, wherein the encapsulation material comprises a silica-filled epoxy.

6. The microelectronic package of claim 1, further including an underfill material disposed between the first microelectronic device and the second microelectronic device.

7. The microelectronic package of claim 1, wherein the first microelectronic device comprises a microprocessor.

8. The microelectronic package of claim 1, wherein the second microelectronic device comprises a memory device.

9. A microelectronic package comprising:
   a first microelectronic device having an active surface, an opposing back surface, and at least one side, wherein the first microelectronic device includes at least one through-silicon via extending partially through the first microelectronic device from the first microelectronic device back surface to a first microelectronic device active portion;
   a second microelectronic device having an active surface facing the first microelectronic active surface, an opposing back surface, and at least one side;
   at least one interconnect electrically connecting and extending between and attached to the first microelectronic device active surface and the second microelectronic device active surface; and
   an encapsulation material adjacent the at least one first microelectronic device side and proximate the at least one second microelectronic device side, wherein the encapsulation material includes a back surface substantially planar to the second microelectronic device back surface.

10. The microelectronic package of claim 9, wherein the encapsulation material includes a front surface proximate the first microelectronic device back surface.

11. The microelectronic package of claim 10, further including a build-up layer formed adjacent encapsulation material front surface.

12. The microelectronic package of claim 11, wherein the build-up layer is electrically connected to the at least one first microelectronic device through-silicon via proximate the first microelectronic device back surface.

13. The microelectronic package of claim 9, wherein the encapsulation material comprises a silica-filled epoxy.

14. The microelectronic package of claim 9, further including an underfill material disposed between the first microelectronic device and the second microelectronic device.

15. The microelectronic package of claim 9, wherein the first microelectronic device comprises a microprocessor.

16. The microelectronic package of claim 9, wherein the second microelectronic device comprises a memory device.

* * * * *